United States Patent [19]
Peil et al.

[11] 3,936,599
[45] Feb. 3, 1976

[54] AUTOMATIC GAIN CONTROL SYSTEM

[75] Inventors: William Peil, North Syracuse; Joseph P. Hesler, Liverpool, both of N.Y.

[73] Assignee: General Electric Company, Syracuse, N.Y.

[22] Filed: Apr. 30, 1975

[21] Appl. No.: 573,190

Related U.S. Application Data

[63] Continuation of Ser. No. 370,916, June 18, 1973, abandoned, which is a continuation-in-part of Ser. No. 304,564, Nov. 7, 1972.

[52] U.S. Cl. ............................ 178/7.3 DC; 325/326
[51] Int. Cl.² .......................................... H04N 5/52
[58] Field of Search ...................... 325/326; 330/10; 178/7.3 R, 7.3 DC, 7.5 DC

[56] References Cited
UNITED STATES PATENTS
3,624,290  11/1971  Hofmann ...................... 178/7.3 DC Primary Examiner—George H. Libman
Assistant Examiner—George G. Stellar
Attorney, Agent, or Firm—Richard V. Lang; Carl W. Baker; Frank L. Neuhauser

[57] ABSTRACT

An automatic gain control system applicable to a television receiver is described. Synchronizing pulses contained in the video detector output are sensed to obtain a measure of the signal strength. This is done by applying the detected output, containing the pulses, to a threshold circuit to produce current increments representative of the excess of said pulses over the threshold. The current increments thus obtained are then applied to a non-linear amplifier which, as a bi-directional source of current, supplies charging or discharging current, depending upon signal strength variation, to an integrating network to obtain a smoothed gain control voltage. The circuit is characterized by both fast attack and fast release and may be used with or without external gating. It is suitable for general AGC control in a television receiver which must be substantially immune to aircraft flutter.

16 Claims, 5 Drawing Figures

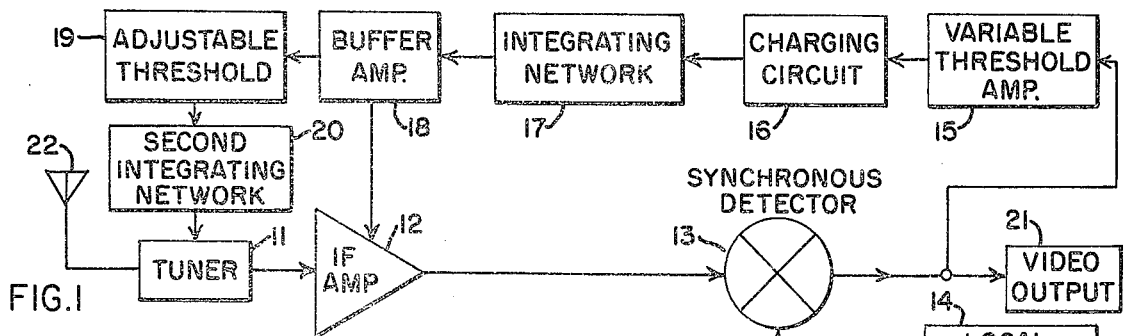
FIG.1
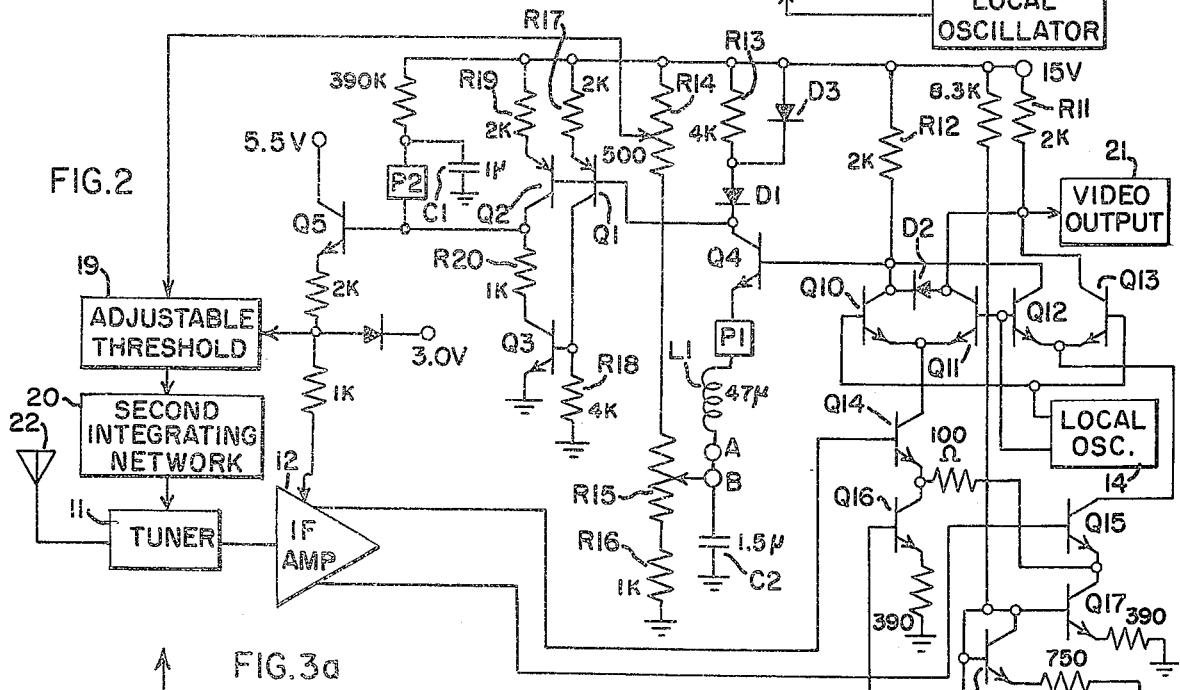
FIG.2
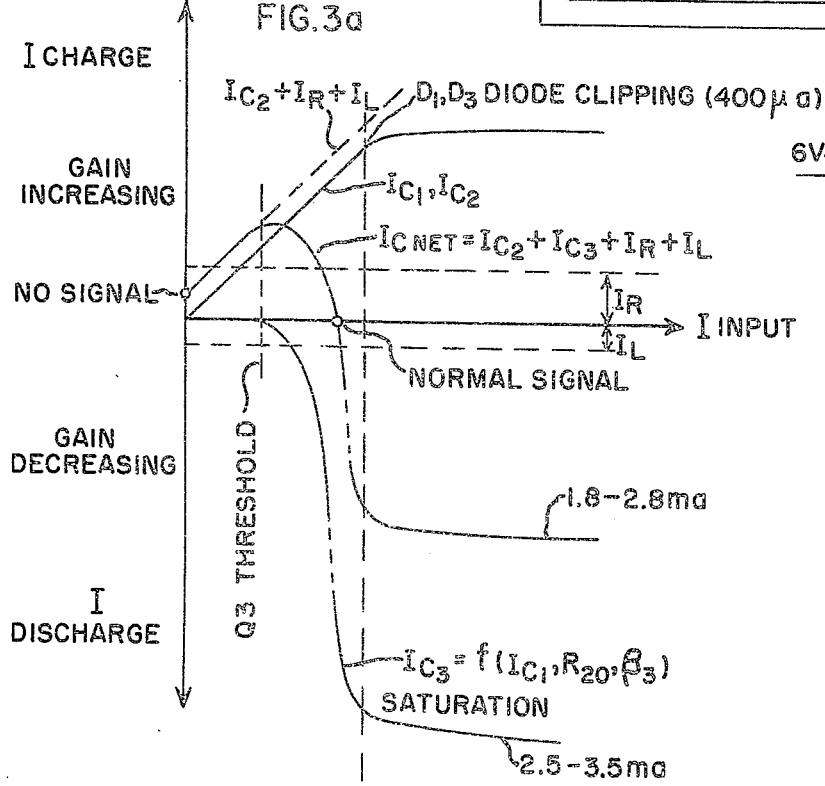
FIG.3a
FIG.3b
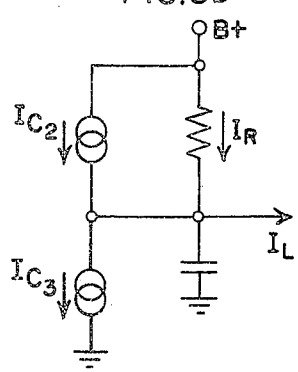
FIG.4 ns of U.S. Pat. Application Ser.
AUTOMATIC GAIN CONTROL SYSTEM

This is a continuation, of application Ser. No. 370,916 filed June 18, 1973 now abandoned, which is a continuation-in-part of U.S. Pat. Application Ser. No. 304,564, filed Nov. 7, 1972, in the name of William Peil et al, entitled "Self-Gating Automatic Gain Control System."

BACKGROUND OF THE INVENTION

1. Field of the Invention

The present invention relates to automatic gain control systems wherein a signal of variable average amplitude is demodulated and the demodulated signal is used to generate a control voltage for regulating the gain of a prior amplifier in a sense to hold the demodulated output at a nearly constant average amplitude.

The automatic gain control system herein provided more specifically relates to television signal reception, wherein a remotely transmitted signal contains pulses of constant modulation index which may be used to define the proper signal level.

2. Description of the Prior Art

Automatic gain control systems are commonplace in receivers for the reception of remotely transmitted signals. This is true in standard amplitude modulation receivers and in television reception systems used in the home, as well as in commercial receivers for other classes of remote transmission. In all such systems, the received signal is sensed to obtain a measure of its received amplitude, and then an electrical quantity proportional to that amplitude is used to regulate the amount of amplification performed on the signal. In the case of television transmission, the signal contains synchronizing pulses which bear a fixed relation to the signal level, representing the maximum carrier level. Thus, if one separates the pulses from the video portion of the signal, one may generated a d.c. gain control voltage which has an average value proportional to the pulse amplitude. This voltage may then be used to regulate the gain of the tuner and the intermediate frequency amplifier of the television receiver to hold the signal at a constant level at the video demodulator.

In the conventional television receiver, the separation of the pulses from the video signal occurs by using a timing pulse created during horizontal "fly back" in the cathode ray tube deflection circuit. The timing pulse is then used to gate on an amplifier stage during the pulse period to separate the pulses from the video portions of the signal. The gated amplifier produces a succession of output pulses, which are applied to a filter to develop a smoothed d.c. voltage, which becomes the gain control voltage. The automatic gain control circuit normally requires appreciable amplification, since the pulse duty cycle is only about 10%.

If not externally gated, the amplification means recharges the smoothing filter through a diode. The recharging rate is then made fast enough to avoid the customary visual flicker problems for the rising part of the signal level. However, the falling part of the signal level depends upon the natural time constants of the RC network to discharge the filter. Since the charging duty cycle is short and droop between the pulses undesirable, the natural time constants of the filter tend to be too long to follow rapid decreases in signal strength. The result is that the overall amplitude regulation of the signal is less than optimum when fast response is desired. AGC circuits without external gating are normally not used in TV receivers because of inability to meet the combined requirements of droop, freedom from aircraft flutter and noise immunity.

Some systems have been developed which provide for fast attack and fast release of the AGC voltage. These, however, have been for applications which are intended to have no d.c. modulation, i.e., in conventional AM receivers. The time constants of such a system are then chosen to average the modulation effects to zero before any action is taken to change the gain of the system relative to the average carrier level. These systems are not applicable to a NTSC TV signal which contains arbitrary amounts of d.c. modulation as a function of picture content.

SUMMARY OF THE INVENTION

It is a principal object of the present invention to provide an improved AGC system.

It is another object of the present invention to provide an improved AGC system having a bi-directionally active current source for fast response both when the signal level increases and the signal level decreases.

It is still another object of the present invention to provide an improved AGC system for television reception which is bi-directionally active for fast response both when the signal level increases and the signal level decreases.

It is an additional object of the present invention to provide an improved AGC system for a television receiver which does not require external gating.

It is a further object of the present invention to provide an improved AGC system for a television receiver which is active bi-directionally for fast attack and fast release, and in which the AGC voltage does not droop.

These and other objects of the invention are achieved in an AGC system comprising a demodulator of modulated signals containing spaced, repetitive pulses representing a maximum carrier level; an amplification stage for the modulated signals, whose output is coupled to the demodulator and whose gain is subject to an electrical control; and a feedback network for automatic gain control of the amplification stage comprising a threshold circuit coupled to the demodulator output for deriving input current increments representative of the excess voltagge of said pulses over said threshold, a non-linear amplifier responsive to said current increments and producing a bi-directional output current as a function of input current, said output current having an initial slope of one sign and corresponding current direction followed by a slope of opposite sign, continuing until conduction is reversed, said later sloping region providing a gain stabilizing action when said feedback loop is closed, said non-linear amplifier having negligible output current in the absence of said current increments, an integrating network for providing a smoothed gain control voltage shunting the output of said non-linear amplifier, and means to couple said integrating network to said amplification stage to increase or decrease the gain thereof about a quiescent point as said non-linear amplifier supplies current to or withdraws current from said integrating network as a function of signal strength.

In accordance with another aspect of the invention, the feedback network couples an output current to said integrating network in response to input current increments which is of limited maximum value in the presence of input signals of excessive voltage so as to provide noise immunity. This noise immunity is achieved by reducing the latter sloping region of said output current characteristic as said maximum value is approached. In order to make the system responsive to primarily the horizontal pulse content in a television reception system, the feedback network is made frequency selective favoring formation of a control voltage from horizontal pulses but discriminating against higher frequency television signal components such as the chrominance and audio portions of said signal.

In accordance with other aspects of the invention, the non-linear bi-directional amplifier circuit comprises a pair of transistor amplifiers whose collector currents to said integrating network are of opposing sense and are summed to charge, balance without net current flow or discharge the integration network in the later sloping region as a function of signal strength. While the first transistor conducts immediately, the second transistor amplifier is designed to commence its current flow after the transistor amplifier is designed to commence its current flow after the input current increments exceed a predetermined second threshold and its gain exceeds the gain of the first amplifier. These provisions permit the current to the integrating network to reverse from a charging to a discharging current condition.

In addition, the first transistor amplifier employs a transistor of a first conductivity type and the second transistor amplifier employs a second transistor of a complementary conductivity type. The emitters of these two mutually complementary transistors are coupled across the d.c. bias source while their collectors are both coupled to the integrating network to provide the bi-directional output current. The delayed second threshold of the second transistor amplifier is provided by biasing the second transistor into cut off and providing a third transistor of the first conductivity type, having its base jointly coupled to the base of the first transistor and receiving the output of the first threshold circuit, and having its collector coupled to the base of said second transistor for turning it on at the second threshold. The threshold circuit employs a fourth transistor of complementary conductivity in a modified turn around circuit having its base coupled to the demodulator output; its emitter returned in a direct current conducting path to an adjustable voltage and to ground in an alternating current path comprising a series inductor; and its collector coupled to the input of the first and third transistors of a complementary current type. The series inductor provides the frequency dependent amplification favoring amplification of frequencies at the horizontal pulse rate and somewhat above but discriminating against higher frequency portions of the television signal such as the chrominance or audio. A forwardly biased diode is provided in the collector load of the fourth transistor to aid in matching the current between the fourth transistor and the first and third transistors. Three resistance are provided connected respectively in series with the diode and in the emitter paths of the second and third transistors for thermal stabilization.

To provide noise immunity to the AGC network, a load resistance is coupled between the collector of the second transistor and the integrating network having a value selected to produce collector saturation and a reduction in the discharging current when a noise pulse at the AGC input exceeds the desired control range. Similarly, forward current charging is restricted, when the desired control range is exceeded by a noise pulse, by use of a second forwardly biased diode shunting the load of the fourth transistor and in series with the first diode. The two series connected diodes restrict the base input voltage applied to the first and third transistors to the sum of the two forward diode drops, a value which permits normal amplification of the rectified horizontal pulses, but which has reduced incremental gain for higher intensity noise pulses. Thus, the AGC circuit exhibits an AGC control characteristic which has a confined negative slope region, and which is substantially immune to noise spikes substantially exceeding the tips of the synchronizing pulses.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

FIG. 1 is a block diagram of an automatic gain control system in accordance with the invention as applied to a television receiver;

FIG. 2 is a mixed block and circuit diagram of the automatic gain control system illustrated in FIG. 1 and particularizing the circuit details instrumental in producing the gain control voltage;

FIG. 3a is a graph illustrating the current flow in an out of the integrating storage capacitor from which the automatic gain control voltage is derived, and FIG. 3b is a simplified equivalent circuit diagram of the major elements contributing the charging and discharging currents which produce the AGC voltage; and FIG. 4 is an optional external gating circuit for the automatic gain control system of FIG. 2 which may be connected between points A and B of that figure.

DESCRIPTION OF THE PREFERRED EMBODIMENT

Referring now to the block diagram of FIG. 1, the automatic gain control system is shown in a television receiver application. The system includes the tuner 11, the intermediate frequency amplifier 12, the synchronous detector 13, local oscillator 14, variable threshold amplifier 15, bi-directional charging circuit 16, integrating network 17, a buffer amplifier 18, adjustable threshold 19, and a second integrating network 20. An antenna 22 couples external television signals to the tuner 11 while the video output means 21 connected to the output of synchronous detector 13 couples the detected video signals to a suitable display.

The foregoing television receiver components are interconnected in the following manner. Television signals received at the antenna are coupled to the tuner 11, which makes a specific channel selection and converts the signal selected to a suitable intermediate frequency. The intermediate frequency signal is then applied to the intermediate frequency amplifier 12 wherein the signals are amplified to a desired signal level prior to detection. Output signal level variations are reduced by an automatic gain control connection to the IF amplifier 12. Its operation will be treated at greater length below. An automatic gain control connection is also provided to the tuner 11. After amplification in 12, the modulated signal is applied to the synchronous detector 13 for demodulation. The synchronous detector 13 demodulates the television signal by multiplying it with waves at the intermediate frequency of the signal supplied from the local oscillator 14. The synchronous detector 13 produces a demodulated output signal which includes the video signal interspersed with the synchronization signals and the audio subcarrier. The demodulated video signal includes the luminance at base band and chrominance components at color subcarrier frequency. The synchronization signals include the vertical and horizontal synchronizing pulses and the color burst. The vertical and horizontal pulses are of a large amplitude and are in the blacker than black position in relation to the video portions of the television signal. They represent a fixed maximum carrier level of the video signal suiting them for use as a measure of the level of the video signal at the television receiver. Thus, the synchronizing pulses may be sensed and used in an automatic gain control system for stabilizing the output against variations in input signal strength. The video portions of the signal demodulated in 13 are applied to the video output 21. There, after suitable processing, they are used to operate the television display. The audio subcarrier take off, not illustrated, also occurs at the demodulator output.

Of particular interest in the present application is the means by which the amplification of the signal is automatically controlled in the tuner 11 and IF amplifier 12 to stabilize the amplitude of the demodulated signal. The automatic gain control system, which performs this function derives its input from the output of the synchronous detector 13.

The first element of the automatic gain control network is the variable threshold amplifier 15. It controls the feedback signal in the feedback network, and when the feedback loop is closed and operating, the threshold setting controls the level of the demodulated video output. The feedback signal includes a portion of the synchronizing pulse content but does not include the variable video modulation from the demodulated signal. Portions of the synchronizing pulses exceeding the threshold setting are then sampled and applied to the bi-directional charging circuit 16.

The bi-directional charging circuit 16, the next block in the feedback loop, has a bi-directional conduction characteristic. The characteristic has a first conduction region in which a peak occurs, providing a gain increasing condition followed by a second conduction region providing a prolonged gain decreasing condition. The normal operating point is at the intersection of these gain increasing and gain decreasing regions on the back slope of the characteristic. The back slope is limited to a maximum value for abnormally large signals.

Completing the feedback loop, the output current from the bi-directional charging circuit is applied to the integrating filter 17 which integrates the current supplied and produces a smoothed d.c. gain control voltage which can swing from a gain increasing to a gain decreasing value. This control voltage is applied from the buffer amplifier 18 to the gain control input of the IF amplifier 12. The output from the integrating network 17 may also be applied through the buffer amplifier 18 to the gain control input of the tuner 11. If the gain reduction in the IF amplifier 12 is programmed, it is usually desirable that the gain be withdrawn from the tuner 11 after some definite amount of gain has been removed from the IF amplifier. For that purpose, an adjustable threshold 19 is provided at the output of the buffer amplifier 18 for delayed application of the gain control voltage to the tuner.

In effecting control, the automatic gain control network normally operates beyond the peak on the downward slope of the conduction characteristic, tending to reduce the signal amplitude when it is too high and to increase it when it is too low, and, in short, to seek a stable output signal level. The demodulator output tends to reach a fixed relation to the threshold of the amplifier 15, thus making the threshold an effective video amplitude control point. The threshold is normally set to hold the signal at the optimum level for demodulator operation.

A more detailed understanding of the foregoing AGC action may now be obtained with reference to FIG. 2, which illustrates the blocks 13, 15, 16, 17 and 18 in circuit diagram form.

The synchronous detector 13 is a four-quadrant multiplier employing four differentially connected transistors Q10, Q11, Q12, Q13 in an upper rank, a pair of lower rank transistors Q14 and Q15, and current source transistors Q16, Q17 and Q18. The emitters of upper rank transistors Q10 and Q11 are paired and driven by the collector of lower rank transistor Q14. The emitters of upper rank transistors Q12, Q13 are also paired and driven by the collector of lower rank transistor Q15. The bases of upper rank transistors Q10 and Q13 are paired and coupled to one terminal of local oscillator 14 while the bases of upper rank transistors Q11, Q12 are paired and connected to the other terminal of local oscillator 14. The IF signal is differentially applied from the IF amplifier 12 between the bases of lower rank transistors Q14 and Q15. The output of the synchronous detector which is the product of the IF and local oscillator signals, appears at the collectors of the upper rank transistors. One output appears at the collectors of transistors Q11 and Q13 and is coupled to the video output 21. The other output appears at the paired collectors of transistors Q10, Q12 and is used for the automatic gain control network. The remaining transistors Q16, Q17, Q18 function in a straightforward fashion with suitable resistances to establish the emitter currents in the upper and lower rank transistors. The collector bias connections are completed by the connection of the upper rank transistors Q11, Q13 through resistance R11 to a positive source of d.c. potentials and the collectors of upper rank transistors Q10, Q12 through resistance R12 to the same source.

A clamping diode D2 is provided coupled between the collector pairs Q11, Q13 and Q10, Q12. Its purpose is to prevent the introduction of any large magnitude whiter than white noise into the video output as a result of a phase reversal in the demodulator output. The diode D2, as illustrated in FIG. 2, is poled for easy current flow from Q11, Q13 to Q10, Q12. Under normal signal conditions it is reversely biased, being poled to present a high impedance with respect to all customary modulation components. Under abnormal conditions, it acts as a clamp to prevent the reversal of the demodulator voltages.

The variable threshold amplifier 15 coupled to the output of detector 13 comprises the transistor Q4, diodes D1 and D3, inductor L1, capacitor C2, and resistances R12 through R16. It transfers metered currents responsive to pulse voltage levels in the detector 13 to the bi-directional charging circuit 16 by a modified "turn around" or inverting circuit. The terms "turn around" or "inverting" are used to imply a reversal of the normal current relation between source and load.

Current normally flows out of one (toward the connection) and into the other (away from the connection). In the present circuit, currents in the driver and in the driven stage both flow toward or both flow away from their point of connection. The circuit is a modified "turn around" in that while the currents between source and load are mutually reversed, the respective current quantities are non-identical, but are approximately proportional at normal current levels.

The demodulated positive going vertical and horizontal pulses appear, together with the demodulated video signal of lesser positive polarity, at the collectors of transistors Q10, Q12 and are applied to the base of transistor Q4. The emitter of Q4 is led through pad P1 (assuming an integrated mode of circuit fabrication) and inductor L1 to the tap on variable resistance R15. A by-pass capacitor C2 couples the tap on R15 to ground. The resistance R15 is normally a manually adjusted potentiometer and nonintegrable. One end terminal of R15 is led to ground through resistance R16 and the other end terminal of R15 is led through variable resistance R14 to the source of positive bias potentials. The tap on potentiometer R14 serves as an adjustment for the delayed AGC and couples a variable voltage to the adjustable threshold 19. The voltage adjustment of the tap on potentiometer R15 sets the transistor Q4 to cut off in the absence of a detected carrier. Upward adjustment of the voltage on the tap of R15 determines how strongly Q4 will be biased toward cut off and reduces the current flow into the feedback network for a given pulse amplitude. The output current of Q4 flows through diode D1 and paralleled resistance R13 and diode D3. The diode D1 is normally a diode connected transistor whose input junction is preferably electrically similar to the input junctions of transistors Q1, Q2. All three input junctions are of similar geometry and in the present integrated configuration, "laterally" formed. The diodes D1 and D3 and resistance R13 form the principal collector load of Q4 for driving transistors Q1 and Q2. They complete the "driver" part of the "turn around" configuration.

The inductor L1 in series with the emitter load of C14 makes the gain of Q4 frequency dependent. It permits maximum gain at the horizontal pulse rate, while tending to reduce the gain at frequencies above 100 Kc to make the circuit less susceptible to influence from higher frequency portions of the demodulated television signal such as the chroma and the sound. The capacitor C2 at the tap of R5 provides a low inpedance by-pass to ground at the horizontal frequency.

The differential charging circuit 16, which is driven by the threshold amplifier 15, comprises three transistors Q1, Q2 and Q3. The circuit 16 functions to generate the bi-directional conduction characteristic earlier noted as a function of input current derived from the variable threshold 15. The transistors Q1 and Q2 are PNP transistors having their bases connected together and to the cathode of the diode D1. The emitters of Q1 and Q2 are coupled to B+ through resistances R17 and R19, respectively, each of 2000 ohms and one-half the value of resistance R13 coupling diode D1 to B+. Collector bias of PNP transistors Q1 and Q2 is provided by their return to near ground potentials. The collector of Q1 is led through 4000 ohm load resistance R18 to ground. The collector of transistor Q2, from which the output of the charging circuit 16 is derived, is coupled to pad P2, to which the filter capacitor C1 of the AGC filter 17 is also coupled, and consequently maintained at low AGC potential. The NPN transistor Q3 has its emitter grounded; its base coupled to the collector of Q1 and to the ungrounded terminal of load resistance R18; and its collector is coupled through 1000 ohm resistance R20 to the pad P2 (the point of low AGC potential).

The above recited circuit provisions create collector currents in driven transistors Q1 and Q2 approximately proportional to the collector current of driver transistor Q4 and in the correct sense for current "turn around." As noted, diode D1 also simulates the input junctions of transistors Q1 and Q2. Finally, the serial resistances connected to all three junction devices (R13, R17 and R19) are made larger. This reduces drift tending to retain current proportionality between driver and load independent of junction variations. Since the driver transistor Q4 is complementary to transistors Q1 and Q2, and since the connection sequences cause current to increase in all three simultaneously, these currents are in the proper sense for current "turn around."

The differential charging circuit is precluded from producing excessive output currents in the presence of large signals by limiting action in the driver stage and saturation in transistor Q3. The limiting action in the driver stage is provided by diodes D1 and D3. Diode D3 is connected in shunt with resistance R13 and in series with diode D1. Both diodes D1 and D3 are poled for easy current flow with respect to current in the collector of transistor Q4 and their series connection limits the magnitude of the voltage swing at the collector of Q4 and the input to transistors Q1 and Q3 to two diode drops below B+. Normally, an output in excess of two diode drops will occur only in the presence of a noise spike substantially in excess of and of the same polarity as the voltage at the tips of the synchronizing pulses. At voltages which are less than the combined diode drop of D1 and D3, the magnitude of the collector voltage of transistor Q4 is proportional to the input voltage supplied by the demodulators. The diodes thus prevent overdriving the amplifiers Q1, Q2, Q3 in the presence of a large transient, which would collapse the voltage on the AGC bus, and cause a perceptible reduction in the intensity of the television picture.

Saturation in transistor Q3 is produced by the connection of the collector of Q3 through R20 of 1000 ohms to the pad P2 of the integrating network. The voltage in the integrating network is small (normally no more than 3.5 volts, and usually less), and the collector resistance forces the transistor into saturation at a predetermined current level. In the present arrangement, saturation is designed to occur at or slightly before clipping occurs in the diodes D1 and D3 but permits Q3 to reach substantially higher current levels than Q1 or Q2. The effect of both diode clipping and saturation is to produce an AGC characteristic whose steep slope in the gain decreasing regions is halted at high input levels such as occur with a noise transient.

The smoothed gain control voltage obtained by filtering the output current from the transistors Q2 and Q3 is applied from the integrating network 17 (at pad P2) to the base of the buffer amplifier 18. The buffer amplifier, containing transistor Q5 in emitter follower configuration, provides additional load isolation for the network 17 and supplies the gain control voltage to IF integrating network 20 as earlier detailed.

The output current of the charging circuit is graphed in FIG. 3(a) as a function of input current with a simplified equivalent circuit representative of the circuit being provided in FIG. 3(b). At no signal condition, Q4 transfers a low or negligible current to Q1 and Q2. Under these conditions, Q3 is held non-conductive, load resistance R18 coupled to its base, having insufficient voltage drop to forward bias the Q3 input junction. Q2 may conduct slightly, but at too slow a rate to cause appreciable voltage integration to C1. The quiescent state for no signal condition is slightly above zero charging rate on C1 (as shown in FIG. 3(a)). As the current in Q4 increases, causing corresponding increases in current in Q1 and Q2, Q2 commences to charge the storage capacitor C1 as shown by the solid, initially straight line of FIG. 3(a), marked $I_{C1}$, $I_{C2}$. As the collector current in Q1 increases, the voltage drop in resistance R18 begins to increase to the point where the input junction of Q3 is forwardly biased, and Q3 begins to conduct. The vertical line marked "Q3 threshold" represents this conduction threshold. Both Q1 and Q2 currents continue to increase until they reach the threshold set by the series diode pair D1, D3. When Q3 conducts it produces a discharging current to capacitor C1, reducing the net charging current to capacitor C1. The effect of Q3 (alone) is shown by the curve marked $I_{C3}$. It has a nonlinear downward slope reaching saturation and flattening at higher signal levels. The collector current of Q3 quickly exceeds the collector current of Q2. The composite conduction characteristic, marked $I_{C\ net}$, thus initially increases linearly, crests nonlinearly after Q3 has become conductive. The region of positive slope thus reaches a maximum forward charging current (typically of about 400 micro amperes). The region of negative slope goes from the maximum charging current through zero, to a high discharging current (typically of about 3.0 milliamperes). The discharge current then tends to level off near this limiting value.

Thus, the feedback network initially increases stored charge in capacitor C1, increasing amplifier gain, and encouraging a higher gain condition for lowest level signals. As the amplifier output level increases, as it will at quite low signal levels, the input feedback current is driven over the maximum value into the negative slope region. In this negative slope region, the characteristic crosses from a gain increasing to a gain decreasing condition and tends to produce a stable operating point dependent upon the setting of R15.

Considered in somewhat greater detail, when the AGC loop is closed and operating under normal, in control condition, the bi-directional charging circuit 16 will operate about a zero average current with essentially equal and simultaneous charge and discharge currents for capacitor C1 from Q2 and Q3. When the input signal increases or decreases, the currents from Q2 and Q3 will no longer be equal, and the net current from the circuit 16 will shift from the zero current operating point. Thus, the circuit will actively charge or discharge C1 as required to adjust the gain of the amplifier 12 and tuner 11 to maintain the signal at an essentially constant level.

The foregoing currents in and out of C1 only flow during the instants that the pulses are being demodulated in the demodulator 13. During the video portion of the signal there is only minor charging or discharging of C1 since the threshold forecloses any introduction of feedback signal into the loop. During the sync pulses, there are major charging and dicharging currents available from transistors Q2 and Q3. The active bi-directional drive thus provides means for rapidly charging and discharging the capacitor C1 since the circuit does not rely upon a passive discharge rate in one portion of the sequence. Furthermore, since the discharging transistor Q3 is of high impedance during video, being cut off during this period, the current drain on the integrating network is small, permitting a relatively small value for C1 before "droop" is encountered between the horizontal pulses.

In addition to feedback currents to capacitor C1, there are relatively fixed charging and discharging currents. FIG. 3(a) shows the charging current ($I_R$) in the charging resistance (390K) and the load current drain ($I_L$). The load current results primarily from the base current into the input junction of the emitter follower Q5, which buffers the intermediate frequency amplifier and tuner AGC loads. The separate current paths to the capacitor are shown schematically in FIG. 3(b) together with arrows indicating the current sense in relation to the capacitor C1.

For proper operation, several current relations should exist. The charging current ($I_R$) must exceed the current drain ($I_L$) into the buffered load. This provides an anti-latch up feature to insure that the AGC voltage increases toward a value corresponding to maximum receiver gain when the received signal strength is inadequate to cause a demodulator output of sufficient amplitude to exceed the conduction threshold of Q4. In addition, the current gain of amplifier Q3 must exceed the current gain of amplifier Q2. In the present circuit embodiment this is arranged by earthing the emitter of Q3 while a large degenerative, gain reducing resistance R19 is connected in the emitter of Q2. The emitter resistance R19 tends to reduce the Veb thermal drift effect of Q2 and at the same time linearizes its input characteristic by degeneration as illustrated in FIG. 3(a). Conversely, the onset of conduction in Q3 is relatively nonlinear since it has no corresponding emitter resistance. Initial nonlinearity in Q3 is of course not essential, nor is it particularly troublesome, since the normal operating point of Q3 is well past the knee of the conduction curve and well into the region of linearity.

The large resistance R17 in series with the emitter of Q1 and the large resistance R13 in series with diode D1 and R19 stabilize the currents in their respective semiconductors against Veb thermal drift and against random errors in circuit parameters, but the precise current relations are not critical. The diode saturation and collector saturation points should occur at about the same place, the collector saturation preferably occurring first.

The resistance in the emitter path of Q4 also minimizes Veb thermal drift and at the same time introduces a finite amount of internal resistance to aid in expanding the dynamic range of AGC correction. Preferably, the voltage at the tap is adjusted so that approximately one-third of the horizontal pulse is clipped and introduced as an error signal into the feedback path.

The potentiometer R15, which adjusts the threshold of 15 and which affects the signal brightness, is normally adjusted for optimum demodulator operation and is not used as a brightness control.

The automatic gain control circuit herein described is designed for use in conventional television receivers. It will accommodate a substantial range of transmitter strengths and accurately follow rapid major signal perturbations such as those arising from airplane flutter. In practice, signal variations of 30 db at a 20 hertz rate may be handled without apparent change in video output level.

The circuit which may be regarded as "self-gating" is acceptably immune to the customary sources of interference without external gating. While a simple threshold mode of discrimination might permit the admission into the feedback loop of portions of the signal other than the horizontal synchronizing pulses, the inductance L1 connected in the emitter path of Q14 prevents this. Thus, the color burst and the sound, which is on a 4.5 megacycle carrier, are both removed and do not affect the AGC characteristic. Noise pulses exceeding the sync tips, which might adversely depress the AGC control potential, are of reduced effect. This is true primarily because of limits in the maximum voltage swing established by the diode pair D1, D3 in the load of Q4 and the saturation of Q3. Finally, the vertical pulses, which have a greater dwell time, and which might tend to create short transients on the AGC bus at the upper lines of the picture, are of minor effect because the circuit can operate with a fast recovery.

Thus, the circuit will function acceptably in most circumstances without external gating and the foregoing measures give performance which makes the AGC acceptably immune to interference in respect to signals of viewable quality. Thus, the margin of usable improvement in noise immunity by using an external gating circuit is quite small. The circuit may, of course, be externally gated by conventional means, such as the circuit shown in FIG. 4. In that figure, a transistor gate is inserted in the emitter load of Q4 and arranged to be gated on during horizontal pulse intervals.

The present AGC system holds the peak carrier level constant, largely independent of the actual average carrier level. It is possible with this system to have no modulation of the carrier and to let the peak carrier power and the average carrier power be the same. The AGC system will in effect operate at the maximum d.c. level of the detector with a duty cycle ranging from a few percent to 100% (full carrier, no modulation). This is in contrast to the conventional gated AGC system in which pulse modulation is required. This advantage is important for testing and trouble shooting, since simple unmodulated signal generators can be used to produce the same AGC characteristic and thus eliminate the need for more expensive signal generator equipment supplying NTSC type video modulation.

The present arrangement, which has two thresholds arranged in series with gain between these thresholds, may be contrasted to an arrangement with paralleled thresholds. The present threshold arrangement allows the two voltage thresholds to be set into near coincidence. If one employs paralleled, reversely poled diodes, one normally requires a difference in setting equal to two diode drops, i.e., 1.4 volts. The present serial arrangement permits the difference to be a few millivolts, depending upon the gain intervening between the first and second threshold devices. Furthermore, while paralleled devices may be prebiased to bring these thresholds into nearer coincidence, the paralleled circuits are also subject to the double thermal drift of two normally opposing sources of drift. In the present arrangement, the second threshold is superimposed on the first threshold. The serial arrangement precludes mutual inversion of the thresholds with close settings and greatly reduces the mutual drift. The serial arrangement is also tolerant to component error.

The circuit has been designed for integrated circuit fabrication. The circuit may also be fabricated in fully integrated, partially integrated, or discrete form. When fully integrated, as part of a larger chip, the incremental pin count is two, requiring a pad for the filter capacitor and a pad for the threshold adjustment.

The circuit configuration and components are readily integrated. The circuit's effectiveness takes into account the tendency of many of the fabrication tolerances to track. The illustrated component values are exemplary but may be modified as need requires.

Furthermore, the circuit configuration may be modified for other modes of automatic gain control. For instance, the slope of the stable control region (See FIG. 3(a)) may be inverted to reduce gain with positive voltage on the AGC bus and increase gain with negative voltage. This may be done by inverting the connections of Q1, Q2, Q3 and the diode between ground and B+, and substituting complementary transistors, the diode junction also being inverted.

What we claim as new and desire to secure by Letters Patent of the United States is:

1. An AGC system comprising:
   a. a demodulator of modulated signals containing spaced repetitive pulses representing a maximum carrier level,
   b. a first amplifier for said modulated signals whose output is coupled to said demodulator and whose gain is subject to electrical control, and
   c. a feedback network not requiring gating to produce a control voltage from said pulses suitable for automatic gain control of said first amplifier, said feedback network comprising:
      1. a second amplifier coupled to the output of said demodulator having a threshold set at less than the maximum carrier level to produce output pulses consisting of portions of said repetitive pulses in excess of said threshold,
      2. a third amplifier coupled to the output of said second amplifier for non-linearly amplifying said thresholded pulses as a function of their magnitude, said third amplifier having an output characteristic having an initial slope of one sign and reproducing said thresholded pulses in the output in a first current direction; followed by a change in slope in said output characteristic to one of opposite sign, continuing until the pulses in the output have a second, reversed current direction, said second sloping region providing a gain stabilizing action when said feedback loop is closed, said third amplifier having negligible output current in the absence of input current,
      3. an integrating network comprising a storage capacitor shunting the output of said third amplifier for providing a smoothed gain control voltage from said non-linearly amplified thresholded pulses, and
      4. means to couple said integrating network to said first amplifier to increase or decrease the gain thereof about a quiescent point as said third, non-linear amplifier supplies current to or withdraws current from said integrating network as a function of signal strength.

2. An AGC system as set forth in claim 1 wherein the output pulses coupled to said integrating network in response to thresholded input pulses are of limited maximum value in the presence of input signals of excessive voltage so as to provide immunity to noise or other extraneous electrical voltages.

3. An AGC system as set forth in claim 2 wherein the third, non-linear amplifier of said feedback network has a restricted maximum reverse output current, said latter sloping region of said output characteristic having a substantially diminished slope as said maximum is approached.

4. An AGC system for application to television signal reception as set forth in claim 1 wherein said feedback network is frequency selective, favoring formation of a control voltage from said spaced repetitive pulses occurring at the horizontal synchronization rate but discriminating against components of said television signal substantially above this frequency range, including the chrominance and audio subcarrier portions of said signal.

5. An AGC system as set forth in claim 1 wherein said third, non-linear amplifier comprises a pair of transistor amplifiers whose collector currents to said integrating network are of opposing sense and are summed to charge, balance without net current flow, or discharge said integrating network as a function of said threshold input pulses.

6. An AGC system as set forth in claim 5 wherein said first transistor amplifier provides a charging current to said integrating network increasing with said input signal and said second transistor amplifier provides a discharging current to said integrating network whose magnitude increases with said input signal, said discharging current commencing after said input current pulses exceed a predetermined second threshold, the gain of said second transistor amplifier exceeding the gain of said first transistor amplifier to reverse the current to said integrating network from a charging to a discharging condition as a function of input current.

7. An AGC system as set forth in claim 6 wherein said first transistor amplifier comprises a first transistor of a first conductivity type, and said second transistor amplifier comprises a second transistor of complementary conductivity type, the emitters thereof being jointly coupled to disparate d.c. potentials and the collectors thereof being joined and coupled to said integrating network for providing the bidirectional output current.

8. An AGC system as set forth in claim 7 wherein said second transistor amplifier is biased into cut-off, turn-on at said second threshold being provided by a third transistor of said first conductivity type having its base jointly coupled with the base of said first transistor to the output of said second amplifier having said first threshold circuit, said third transistor having its collector coupled to the base of said second transistor for effecting said turn-on.

9. An AGC system as set forth in claim 8 wherein said third, non-linear amplifier has a restricted negative output current in response to input current increments, said restriction in output current being achieved, at least in part, by use of a collector load resistance connected between the collector of said second transistor and said integrating network and proportioned to cause collector saturation which substantially diminishes the slope of said output current as said maximum value is approached, so as to provide immunity to noise or other extraneous electrical voltages.

10. An AGC system as set forth in claim 9 wherein said second amplifier having said first threshold comprises a fourth transistor of complementary conductivity type having its base coupled to the demodulator output, its emitter returned to an adjustable voltage and its collector coupled to the input junctions of said first and third transistors.

11. An AGC system as set forth in claim 10 wherein said feedback network has a restricted maximum reverse output current in response to input current, said restriction in output current being achieved, at least in part, by use of a diode clamp coupled to the output of the collector of said fourth transistor and connected for forward conduction so that when the forward diode drop is exceeded, clamping occurs at the input to said first and third transistor amplifiers to establish maximum limits to said input current.

12. An AGC system as set forth in claim 11 having in addition thereto a collector load resistance for said fourth transistor, a first forward biased diode connected in shunt therewith and a second forward biased diode connected in series with said load and shunting diode, said first and second diodes providing said clamping function and said second diode facilitating an approximately proportional current turn around at normal signal levels between said fourth transistor as a source and said first and third transistors as loads.

13. An AGC system as set forth in claim 12 wherein an inductor is provided to the emitter path of said fourth transistor to cause frequency selective operation of said threshold circuit favoring the formation of input current from said spaced repetitive pulses occurring at the horizontal synchronization rate but discriminating against the formation of input current from components of said television signal substantially above this frequency range including the chrominance and audio subcarrier portions of said signal.

14. An AGC system as set forth in claim 13 wherein three resistances are provided connected respectively in series with said diode and in the emitter paths of said second and third transistors for thermal stabilization thereof.

15. An AGC system as set forth in claim 14 wherein the parameters of said feedback network are adjusted to cause said first threshold to occur in a normal signal condition substantially within said horizontal pulses to achieve a substantial linear dynamic range for said AGC system extending in both a gain increasing and a gain decreasing direction.

16. An AGC system as set forth in claim 1 wherein said second amplifier having a threshold is gated on during said repetitive pulses to improve noise immunity.

* * * * *